(12) United States Patent
Lagouge et al.

(10) Patent No.: US 9,586,812 B2
(45) Date of Patent: Mar. 7, 2017

(54) DEVICE WITH VERTICALLY INTEGRATED SENSORS AND METHOD OF FABRICATION

(71) Applicant: FREESCALE SEMICONDUCTOR, INC., Austin, TX (US)

(72) Inventors: Matthieu Lagouge, Brossard (CA); Mamur Chowdhury, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/682,282

(22) Filed: Apr. 9, 2015

(65) Prior Publication Data

US 2016/0297673 A1 Oct. 13, 2016

(51) Int. Cl.
*B81B 7/00* (2006.01)
*B81C 1/00* (2006.01)

(52) U.S. Cl.
CPC ........ *B81B 7/0074* (2013.01); *B81C 1/00301* (2013.01); *B81B 2201/0264* (2013.01)

(58) Field of Classification Search
CPC ............................ B81B 7/0074; B81C 1/00301
See application file for complete search history.

(56) References Cited

U.S. PATENT DOCUMENTS

| | | |
|---|---|---|
| 7,159,459 B2 | 1/2007 | Gogoi |
| 8,220,330 B2 | 7/2012 | Miller et al. |
| 8,350,346 B1 | 1/2013 | Huang et al. |
| 8,487,387 B2 | 7/2013 | Lin et al. |
| 2006/0001123 A1* | 1/2006 | Heck ..................... B81C 1/0023 257/528 |
| 2010/0025845 A1 | 2/2010 | Merz et al. |
| 2012/0256282 A1* | 10/2012 | Lin ........................... B81B 7/02 257/415 |
| 2012/0326248 A1 | 12/2012 | Daneman et al. |
| 2013/0340525 A1* | 12/2013 | Liu ...................... G01P 15/0802 73/514.11 |
| 2014/0048910 A1 | 2/2014 | Liu |
| 2015/0329351 A1* | 11/2015 | Cheng ..................... B81B 7/007 257/417 |

* cited by examiner

*Primary Examiner* — Charles Garber
*Assistant Examiner* — Brigitte Paterson
(74) *Attorney, Agent, or Firm* — Charlene R. Jacobsen

(57) ABSTRACT

A device includes vertically and laterally spaced sensors that sense different physical stimuli. Fabrication of the device entails forming a device structure having a first and second wafer layers with a signal routing layer interposed between them. Active transducer elements of one or more sensors are formed in the first wafer layer and a third wafer layer is attached with the second wafer layer to produce one or more cavities in which the active transducer elements are located. A trench extends through the second wafer and through a portion of the signal routing layer. The trench electrically isolates a region of the second wafer layer surrounded by the trench from a remainder of the second wafer layer. Another active transducer element of another sensor is formed in this region. The transducer element formed in the second wafer layer may be a diaphragm for a pressure sensor of the sensor device.

14 Claims, 7 Drawing Sheets

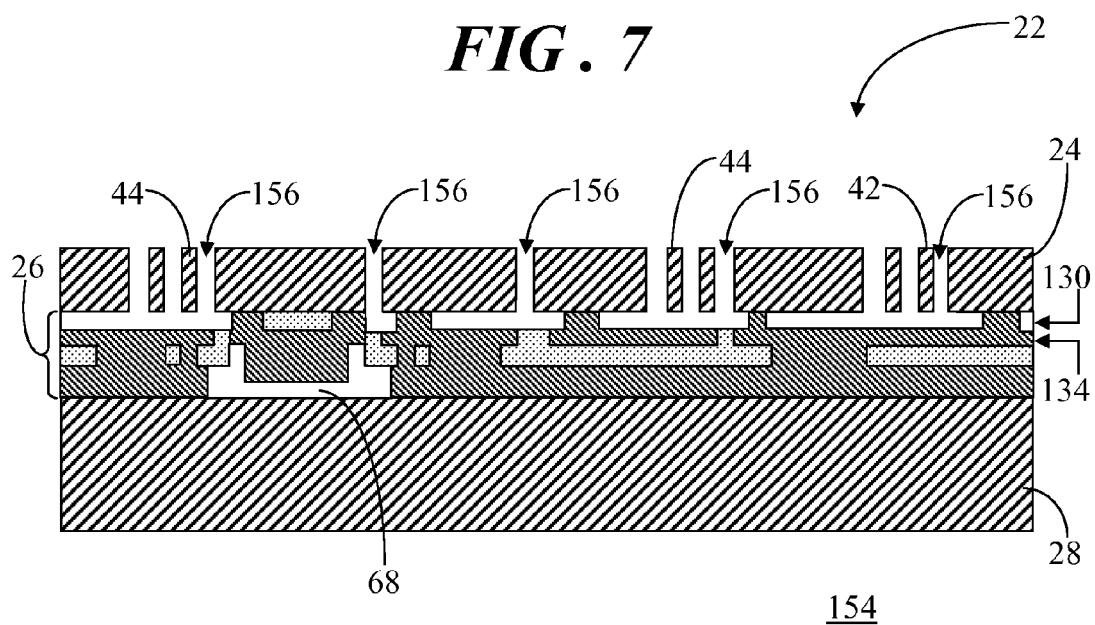
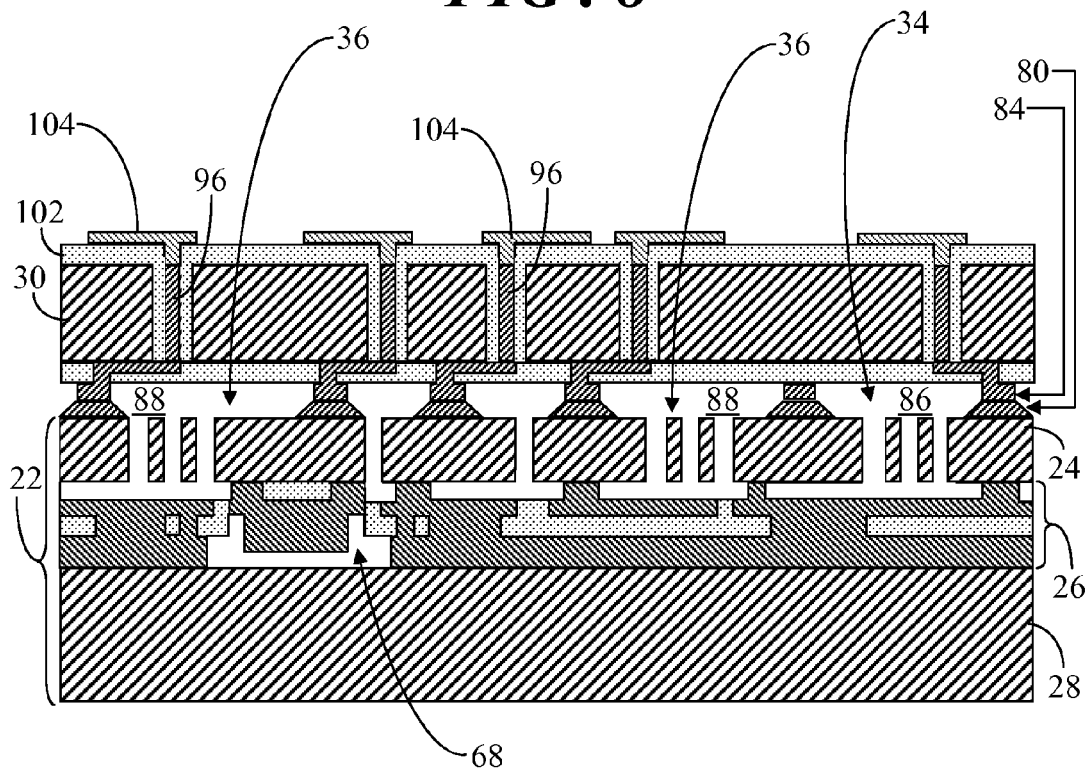

DEVICE WITH VERTICALLY INTEGRATED SENSORS AND METHOD OF FABRICATION

TECHNICAL FIELD OF THE INVENTION

The present invention relates generally to sensor devices. More specifically, the present invention relates to a sensor device having vertically integrated sensors and a method of fabricating the sensor device.

BACKGROUND OF THE INVENTION

Microelectromechanical systems (MEMS) devices are semiconductor devices with embedded mechanical components. MEMS devices include, for example, pressure sensors, accelerometers, gyroscopes, microphones, digital mirror displays, micro fluidic devices, resonators, flow sensors, and so forth. MEMS devices are used in a variety of products such as automobile airbag systems, control applications in automobiles, navigations, display systems, inkjet cartridges, and so forth.

As the uses for MEMS sensor devices continue to grow and diversify, increasing emphasis is being placed on the development of advanced silicon MEMS sensor devices capable of sensing different physical stimuli at enhanced sensitivities and for integrating these sensors into the same package. In addition, increasing emphasis is being placed on fabrication methodology for MEMS sensor devices that achieves multiple stimulus sensing capability without increasing manufacturing cost and complexity and without sacrificing part performance. Forming a sensor having multiple stimulus sensing capability in a miniaturized package has been sought for use in a number of applications. Indeed, these efforts are primarily driven by existing and potential high-volume applications in automotive, medical, commercial, and consumer products.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

FIG. 7 shows a side sectional view of the structure of FIG. 5 at a subsequent stage of fabrication;

FIG. 8 shows a side sectional view of the structure of FIG. 6 at a subsequent stage of fabrication;

DETAILED DESCRIPTION

Figure 1:
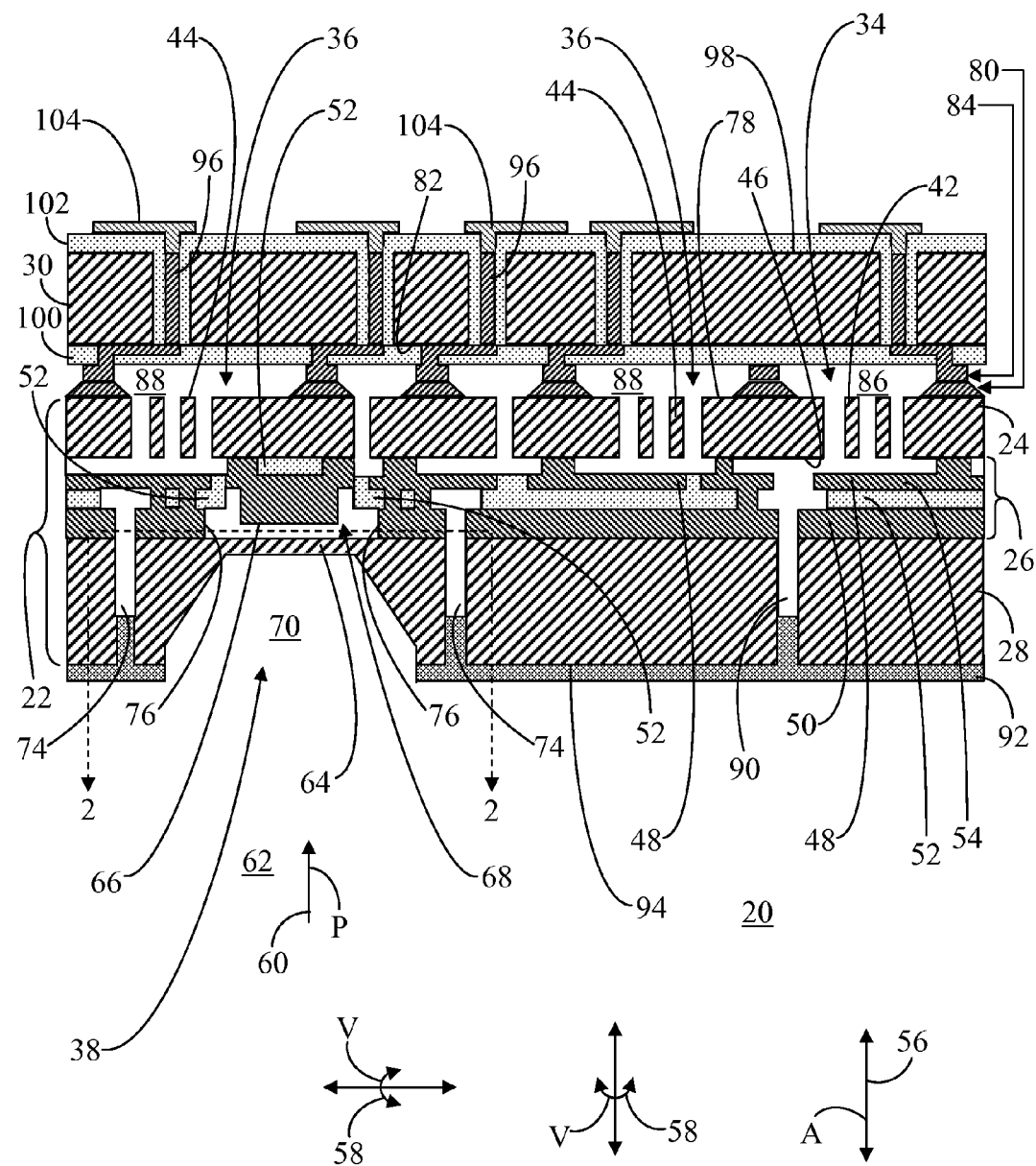
FIG. 1 shows a sectional side view of a microelectromechanical systems (MEMS) sensor device having vertically integrated sensors in accordance with an embodiment.

In overview, an embodiment of the present invention entails a microelectromechanical systems (MEMS) sensor device capable of sensing different physical stimuli and methodology for fabricating the sensor device. In particular, the sensor device includes laterally and vertically spaced integrated sensors, each of which may sense a different physical stimulus. In an embodiment, one sensor of the sensor device is a pressure sensor that uses a diaphragm and a pressure cavity to create a variable capacitor to detect strain (or deflection) due to applied pressure over an area. Other sensors of the sensor device may be an accelerometer, gyroscope, magnetometer, and so forth that are capable of creating a variable capacitance in response to sensed stimuli. Still other MEMS devices that may be incorporated into the structure includes an oscillator or an energy harvesting device. A MEMS device with multi-stimulus sensing capability can be implemented within an application calling for four or more degrees of freedom for automotive, medical, commercial, and industrial markets.

Fabrication methodology for the sensor device entails fabrication of a stacked configuration of at least two or more wafer layers with laterally and vertically spaced sensors. The laterally and vertically spaced sensors can include any suitable combination of, for example, a pressure sensor, microphone, accelerometers, angular rate sensors, and/or magnetometers. However, other sensors, MEMS devices, and integrated circuits may be incorporated as well. In an embodiment, the fabrication methodology exploits a polysilicon to silicon bonding technique (conductive interface) to form a pressure sensor from the back side of a handle wafer. The fabrication methodology further allows options for integration of a pressure sensor with a single crystal silicon (SCS) diaphragm. A pressure sensor cavity is formed in a signal routing layer between a portion of the handle wafer and a device wafer layer. Therefore, the pressure sensor and its cavity do not compete with sensors formed in the device wafer layer.

In an embodiment, the fabrication methodology enables the sensors to be located in separate isolated cavities that exhibit different cavity pressures for optimal operation of each of the sensors. The fabrication methodology further enables a technique for stacking multiple wafers with different sensing circuitry to create four, six, seven, nine, and ten degree-of-freedom (DOF) sensor devices. Electrically conductive through-silicon-vias (TSVs) may be implemented to eliminate the bond pad shelf of some MEMS sensor devices, thereby further reducing MEMS sensor device dimensions and enabling chip scale packaging. Accordingly, fabrication methodology described herein may yield a multiple stimulus sensor device with enhanced function, sensitivity, and durability, reduced dimensions, and that can be cost effectively fabricated utilizing existing manufacturing techniques.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued. It is further understood that the use of relational terms, if any, such as first and second, top and bottom, and the like are used solely to distinguish one from another entity or action without necessarily requiring or implying any actual such relationship or order between such entities or actions.

Figure 2:
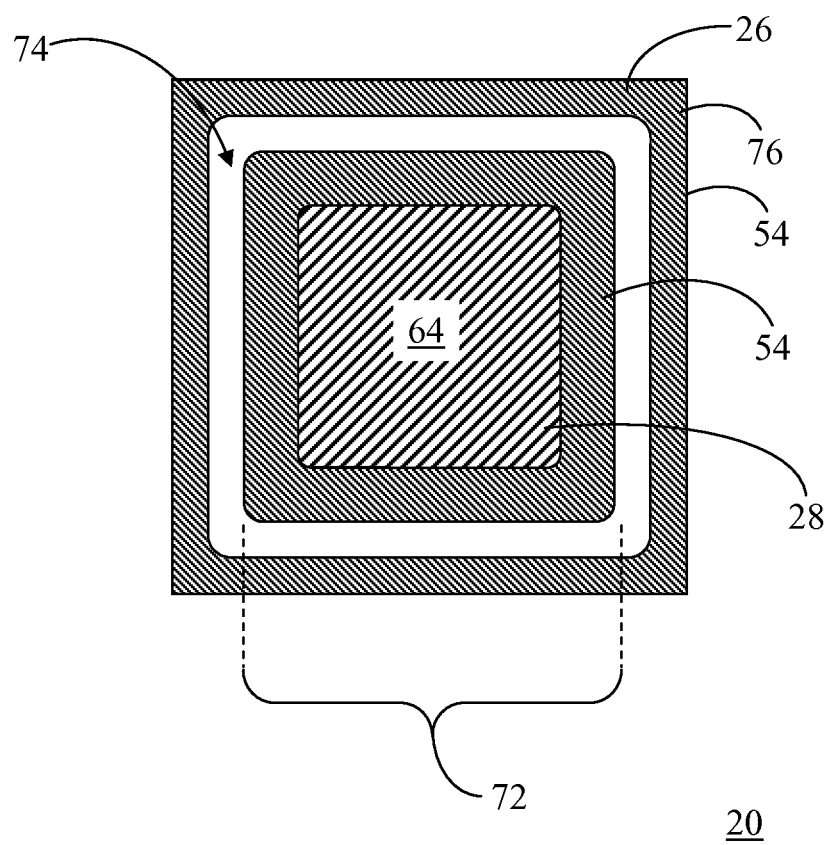
FIG. 2 shows a top sectional view of a portion of the MEMS sensor device along section lines 2-2 of FIG. 1.

Referring to FIGS. 1 and 2, FIG. 1 shows a sectional side view of a microelectromechanical systems (MEMS) sensor device 20 having vertically integrated sensors in accordance with an embodiment and FIG. 2 shows a top sectional view of a portion of MEMS sensor device 20 along section lines 2-2 of FIG. 1. FIGS. 1, 2, and subsequent FIGS. 4-11 are illustrated using various shading and/or hatching to distinguish the different elements of sensor device 20, as will be discussed below. These different elements within the structural layers may be produced utilizing current and upcoming micromachining techniques of depositing, patterning, etching, and so forth.

Sensor device 20 includes a device structure 22 having a first wafer layer 24, a signal routing layer 26 bonded to or formed on first wafer layer 24, and a second wafer layer 28. Sensor device 20 further includes a third wafer layer 30 attached with device structure 22 which serves as a cap for device structure. In an embodiment, sensor device 20 includes one or more accelerometers 34 (one stylistically shown), one or more angular rate sensors 36 (two stylistically shown), and a pressure sensor 38 (or alternatively, a microphone). Alternative embodiments may include different sensors than those described herein.

Accelerometer 34 and angular rate sensor 36 are formed in device structure 22. More particularly, an active transducer element 42 of accelerometer 34 is formed in first wafer layer 24 of device structure 22. Active transducer element 42 may include one or more movable elements, sometimes referred to proof masses, that are capable of movement in response to an acceleration force. Similarly, active transducer elements 44 of angular rate sensors 36 are formed in first wafer layer 24 of device structure 22. Active transducer elements 44 may include one or more movable elements that are capable of movement in response to angular velocity. Thus, first wafer layer 24 serves as a device wafer for sensor device 20.

Signal routing layer 26 is coupled with, but is generally spaced apart from a first side 46 of first wafer layer 24. Signal routing layer 26 can include components 48 for either or both of accelerometer 34 and angular rate sensor 36 for suitably carrying output signals, for providing a ground plane 50, and the like. In the illustrated embodiment, signal routing layer 26 is formed of multiple electrically insulating layers (e.g., dielectric 52, represented by shaded areas) and electrically conductive layers (e.g., polysilicon 54, represented by rightwardly and downwardly directed hatching).

In this exemplary embodiment, accelerometer 34 is configured to sense a linear acceleration stimulus (A), represented by a bi-directional arrow 56. In general, accelerometer 34 may adapted to sense linear acceleration stimulus 56 as movement of active transducer element 42 relative to fixed elements 48 underlying active transducer element 42. A change in a capacitance between the fixed elements 48 and active transducer element 42 as a function of linear acceleration stimulus 56 can be registered by sense circuitry (not shown) and converted to an output signal representative of linear acceleration stimulus 56.

Angular rate sensors 36 are configured to sense an angular rate stimulus, or velocity (V), about one or more axes as represented by curved bi-directional arrows 58. In general, angular rate sensors 36 are adapted to sense angular rate stimulus 58 as movement of active transducer elements 44 relative to fixed elements 48 underlying active transducer elements 44 or other fixed elements (not shown). A change in a capacitance between the fixed elements and active transducer elements 44 as a function of angular rate stimulus 58 can be registered by sense circuitry (not shown) and converted to an output signal representative of angular rate stimulus 58.

Only generalized descriptions of inertial sensors, i.e., accelerometer 34 and angular rate sensors 36, are provided herein for brevity. It should be understood that in alternative embodiments, accelerometer 34 can be any of a plurality of single and multiple axis accelerometer structures configured to sense linear motion in one or more directions. Likewise, angular rate sensor 36 can be any of a plurality of single and multiple axis angular rate sensor structures configured to sense angular rate about one or more axes of rotation. Furthermore, sensors 34, 36 may be any of a variety of sensors, components, and the like in accordance with a particular design.

In accordance with a particular embodiment, pressure sensor 38 can underlie one or all of active transducer elements 42, 44 of the sensors formed in first wafer layer 24. By way of example, pressure sensor 38 underlies active transducer elements 44 of angular rate sensors 36, and is therefore vertically displaced from angular rate sensors 36.

In an embodiment, pressure sensor 38 is configured to sense a pressure stimulus (P), represented by an arrow 60, from an environment 62 external to sensor device 20. Pressure sensor 38 includes an active transducer element, referred to herein as a diaphragm 64, and a pressure sensor element, referred to herein as a reference element 66. Diaphragm 64 is formed in second wafer layer 28 and reference element 66 is formed in signal routing layer 26 and resides in a pressure cavity 68 produced in signal routing layer 26. Diaphragm 64 is vertically aligned with reference element 66 and is spaced apart from reference element 66 so as to form a gap between diaphragm 64 and reference element 66. Diaphragm 64 is exposed to external environment 62 via a port 70 extending through second wafer layer 28 to diaphragm 64.

Diaphragm 64 is capable of movement in a direction that is generally perpendicular to a plane of sensor device 20 in response to pressure stimulus 60 from external environment 62. Pressure sensor 38 uses diaphragm 64 and the pressure within pressure cavity 68 (typically less than atmospheric pressure) to create a variable capacitor to detect strain due to applied pressure, i.e., pressure stimulus 60. As such, pressure sensor 38 senses pressure stimulus 60 from environment 62 as movement of diaphragm 64 (i.e., the active transducer element) relative to reference element 66. A change in capacitance between reference element 66 and diaphragm 64 as a function of pressure stimulus 60 can be registered by sense circuitry (not shown) and converted to an output signal representative of pressure stimulus 60.

As best seen in FIG. 2, diaphragm 64 of pressure sensor 38 is formed in a region 72 of second wafer layer 28 fully surrounded by a trench 74. Trench 74 extends through an entirety of second wafer layer 28 and through a portion 76 of signal routing layer 26 where it stops at dielectric 52 of signal routing layer 26. Thus, trench 74 electrically isolates region 72 of second wafer layer 28 from a remainder of second wafer layer 28. Accordingly, diaphragm 64 is electrically isolated from reference element 66 as wells as features of the inertial sensors, e.g., accelerometer 42 and angular rate sensors 44. Furthermore, by locating diaphragm in second wafer layer 28, savings can be achieved in terms of the size of the sensor die. Additionally, diaphragm 64 can be readily fabricated with a relative large surface area and a relatively thin profile to attain a desired sensitivity for pressure sensor 38.

Third wafer layer 30 is attached with a second side 78 of first wafer layer 24. In some embodiments, third wafer layer 30 is coupled to second side 78 of first wafer layer 24 using an electrically conductive bonding layer 80 that forms a conductive interconnection between device structure 22 and third wafer layer 30. Conductive bonding layer 80 may be implemented using a two layer metal-based bonding technique, for example, eutectic Aluminum-Germanium (Al—Ge) bonding, eutectic Gold-Tin (Au—Sn) bonding, thermocompression Copper-Copper (Cu—Cu) bonding, Copper-Tin (Cu—Sn) bonding, Aluminum-Silicon (Al—Si) bonding, and so forth. Alternatively, third wafer layer 30 may be coupled to second side 78 of first wafer layer 24 using direct bonding, i.e., silicon-silicon and/or silicon-polysilicon.

Conductive bonding layer 80 may be suitably thick so that a bottom side 82 of third wafer layer 30 is displaced away from and does not contact second side 78 of first wafer layer 24 thereby producing at least one hermetically sealed cavity in which accelerometer 34 and angular rate sensor 36 are located. In some configurations, electrically conductive spacers 84 may be utilized to so that bottom side 82 of third wafer layer 30 is suitably displaced away from second side 78 of first wafer layer 24. And in still other configurations, third wafer layer 30 may additionally have cavity regions (not shown) extending inwardly from bottom side 82 of third wafer layer 30 to enlarge (i.e., deepen) the at least one hermetically sealed cavity.

In the illustrated embodiment, device structure 22 of sensor device 20 includes at least two physically isolated and hermetically sealed transducer cavities 86, 88. That is, conductive bonding layer 80 and spacers 84, interconnecting third wafer layer 30 with device structure 22, are formed to include multiple sections defining boundaries between the physically isolated transducer cavities 86, 88. In the exemplary embodiment, accelerometer 34 is located in transducer cavity 86 and angular rate sensors 36 are located in transducer cavities 88.

Another trench 90 extends through second wafer layer 28 and through the entire thickness of signal routing layer 26 to transducer cavity 86 for said accelerometer 34. However, a trench does not extend through second wafer layer 28 and through the entire thickness of signal routing layer 26 to transducer cavities 88 for angular rate sensors 36. Trench 90 enables transducer cavity 86 to be in fluid communication with external environment 62 at least temporarily during fabrication, as will be discussed below. However, the absence of a trench through second wafer layer 28 and through signal routing layer 26 to transducer cavity 88 enables transducer cavity 88 to be effectively isolated from external environment 62 during certain process operations to produce transducer cavity 88 having a different cavity pressure than a cavity pressure of transducer cavity 86. This feature will be described in significantly greater detail in connection with fabrication methodology presented in FIG. 2.

A sealant material 92 is deposited across an exposed back side 94 of second wafer layer 28 and into each of trenches 74 and 90. Sealant material 92 may be an electrically isolating material such as tetraethyl orthosilicate (TEOS) which is used to seal trenches 74 and 90 during fabrication processes (discussed below). Trenches 74 and 90 are sealed to prevent contaminants from getting into sensor device 20, to increase the mechanical robustness of sensor device 20, and to form a new controlled pressure environment for accelerometer 34 relative to the pressure environment for angular rate sensors 36. Again, this feature will be described in significantly greater detail in connection with fabrication methodology presented in FIG. 2.

Third wafer layer 30 may further include at least one electrically conductive through-silicon-via (TSV) 96, also known as a vertical electrical connection, extending through third wafer layer 30 from bottom side 82 of third wafer layer 30 to a top side 98 of third wafer layer 30. Conductive vias 92 may be electrically coupled with conductive bonding layer 80 to suitably carry signals to and from accelerometer 34, angular rate sensor 36, and/or pressure sensor 38 of sensor device 20.

Third wafer layer 30 may further include a dielectric layer 100 formed on bottom side 82 and another dielectric layer 102 formed on top side 98 of third wafer layer 30. Dielectric layers 100, 102 provide electrical isolation for those elements on or in third wafer layer 30. Conductive vias 96 may be electrically coupled to conductive interconnects 104 formed on or embedded in dielectric layer 102. Conductive interconnects 104 may be located at top side 98 of third wafer layer 30 in lieu of their typical location laterally displaced from, i.e., beside, the device structure on a bond pad shelf. As such, in an embodiment, conductive interconnects 104 may be attached to a circuit board via a solder ball technique when sensor device 20 is packaged in a flip chip configuration. Such vertical integration effectively reduces the footprint of sensor device 20 relative to some prior art sensor devices. Only a few conductive vias 96 and conductive interconnects 104 are shown for simplicity of illustration. However, it should be understood that sensor device 20 may include any suitable quantity of conductive vias 96, where one each of conductive vias 96 is electrically connected to a particular conductive interconnect 104.

Third wafer layer 30 may further include integrated circuits, additional sensors (e.g., a magnetometer), and the like formed in or on third wafer layer 30. The integrated circuits can be any control circuitry, microprocessor(s), memory, sensors, and other digital logic circuits pertinent to the function of sensor device 20. These additional devices are not shown herein for simplicity of illustration. The magnetometer can be a single axis or multiple axis magnetic field sensor fabricated in accordance with known methodologies and materials. Third wafer layer 30 can be suitably processed to produce the integrated circuits, additional sensors, and the like utilizing, for example, CMOS process techniques.

Various MEMS sensor device packages include a sealed cap that covers the active transducer elements and seals them from moisture and foreign materials that could have deleterious effects on device operation. Additionally, some MEMS sensor devices have particular pressure requirements in which they most effectively operate. For example, a MEMS pressure sensor is typically fabricated so that the pressure within its cavity is below atmospheric pressure, and more particularly near vacuum. Angular rate sensors may also most effectively operate in a vacuum atmosphere in order to achieve a high quality factor for low voltage operation and high signal response. Conversely, other types of MEMS sensor devices should operate in a non-vacuum environment in order to avoid an under damped response in which movable elements of the device can undergo multiple oscillations in response to a single disturbance. By way of example, an accelerometer may require operation in a damped mode in order to reduce shock and vibration sensitivity. Therefore, multiple sensors in a single package may have different pressure requirements for the cavities in which they are located.

Accordingly, methodology described in detail below provides a technique for fabricating a space efficient, multi-stimulus MEMS sensor device, such as sensor device 20, in which multiple sensors can be vertically and laterally integrated on a single chip, but can be located in separate isolated cavities that exhibit different cavity pressures suitable for effective operation of each of the sensors. Moreover, the multi-stimulus sensor device can be cost effectively fabricated utilizing existing manufacturing techniques.

Figure 3:
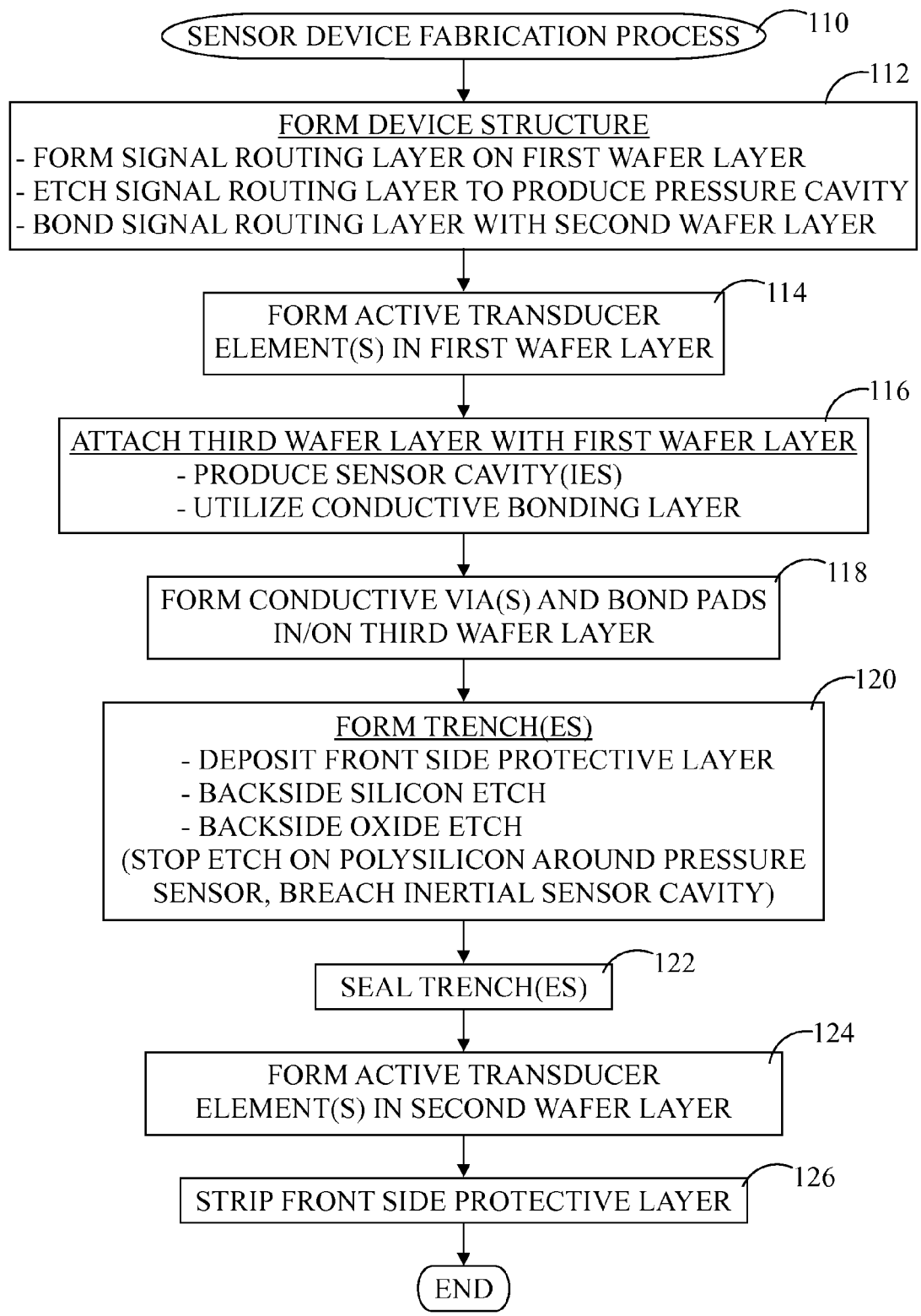
FIG. 3 shows a flowchart of a sensor device fabrication process in accordance with another embodiment.

Referring to FIGS. 1-3, FIG. 3 shows a flowchart of a sensor device fabrication process 110 for producing a multi-stimulus MEMS sensor device, such as MEMS sensor device 20, in accordance with another embodiment. Process 110 generally describes methodology for concurrently forming the elements of the vertically and laterally spaced sensors 34, 36, 38. Fabrication process 110 implements known and developing MEMS micromachining technologies to cost effectively yield sensor device 20 having multiple stimulus sensing capability. Fabrication process 110 is described below in connection with the fabrication of a single sensor device. However, it should be understood by those skilled in the art that the following process allows for concurrent wafer-level manufacturing of a plurality of sensor devices. The individual sensor devices can then be separated, cut, or diced in a conventional manner to provide individual sensor devices that can be integrated into an end application.

Sensor device fabrication process 110 begins with a block 112. At block 112, fabrication processes related to the formation of device structure 22 are performed. These fabrication processes entail deposition, patterning, and etching of insulating dielectric 52 and polysilicon 54 to form signal routing layer 26 on first wafer layer 24 and to produce pressure cavity 68. These fabrication processes further entail bonding signal routing layer 26 with second wafer layer 28 of first and second wafer layers 24, 28 to produce device structure 22. Exemplary fabrication processes related to the formation of device structure 22 are described below in connection with FIGS. 4-6.

At a block 114 of sensor device fabrication process 110, one or more active transducer elements, e.g., elements 42, 44, are formed in first wafer layer 24, as described below in connection with FIG. 7. At a block 116, third wafer layer 30 is attached with first wafer layer 24 of device structure 22 and at a block 118, conductive vias 96 and conductive interconnects 104 are formed in or on third wafer layer 30, as described in connection with FIG. 8.

At a block 120, fabrication processes related to the formation of trenches 74 and 90 in second wafer layer 28 are performed. These fabrication processes can entail front side deposition of a protective layer, back side silicon etch, and back side oxide etch. These fabrication processes can further entail stop etching on polysilicon 54 around region 72 at which diaphragm 64 of pressure sensor 38 will be located and breaching transducer cavity 86 for accelerometer 34. Exemplary fabrication processes related to the formation of trenches 74 and 90 are described in connection with FIG. 9.

Sensor device fabrication process 110 continues at a block 122. At block 122, trenches 74 and 90 are sealed using electrically isolating sealant material 92, as described in connection with FIG. 10. At a block 124, active transducer element(s), e.g., diaphragm 64, for pressure sensor 38 is formed in second wafer layer 28, as described in connection with FIG. 11. Thereafter, at a block 126, the front side protective layer is stripped. Following block 126, additional operations may ensue during the execution of sensor device fabrication process 110. These additional operations may include, for example, wafer level testing, singulation of the sensor devices, bonding with an application specific integrated circuit, and so forth. These additional operations are not described herein for brevity.

Figure 4:
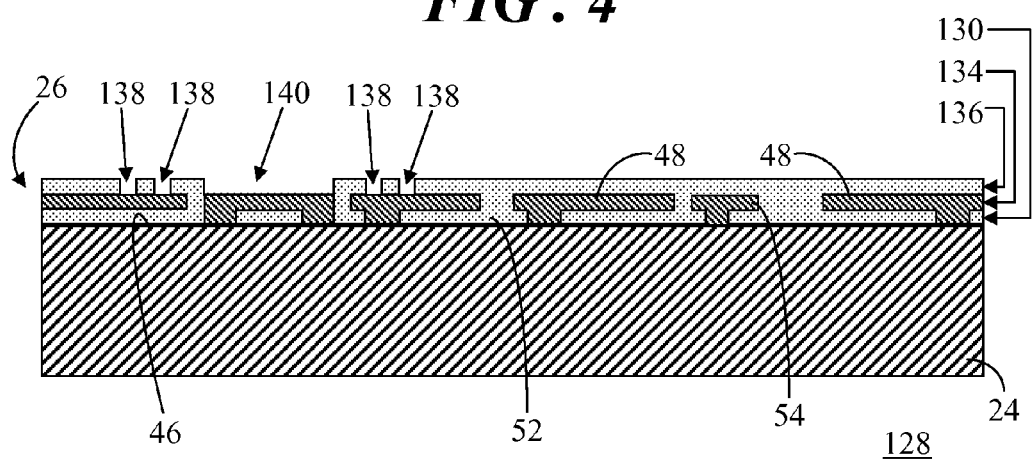
FIG. 4 shows a side sectional view of a structure at an initial stage of fabrication in accordance with the process of FIG. 3.

Referring to FIG. 4 in connection with sensor device fabrication process 110 (FIG. 3), FIG. 4 shows a side sectional view of a structure at an initial stage 128 of fabrication. In accordance with block 112 of sensor device fabrication process 110, device structure 22 is formed. At initial stage 128 of fabrication represented by FIG. 4, signal routing layer 26 is partially formed on first wafer layer 24. By way of example, a first insulator layer 130 of dielectric 52 may be formed on first side 46 of first wafer layer 24. First insulator layer 130 may be suitably patterned and etched. Thereafter, a first electrically conductive layer 134, e.g., a polysilicon 54, may be deposited over first insulator layer 130. Polysilicon 54 will fill any openings that were previously produced in first insulator layer 130.

Following deposition, first conductive layer 134 of polysilicon 54 can be suitably patterned and etched to form, for example, components 48 of accelerometer 34 and/or angular rate sensors 36. Next, a second insulator layer 136 of dielectric 52 may be formed on first conductive layer 134. Dielectric 52 of second insulator layer 136 will fill any openings that were previously produced in first conductive layer 134. This second insulator layer 136 may also be suitably patterned and etched to form openings. By way of example, openings 138 are formed extending through second insulator layer 136 which will define an electrically conductive connection between first conductive layer 134 and a second electrically conductive layer, discussed in connection with FIG. 5. It should be particularly observed that a relatively large opening 140 is also formed in second insulator layer 136. This relatively large opening 140 forms the basis for producing pressure cavity 68 in signal routing layer 26.

Figure 5:
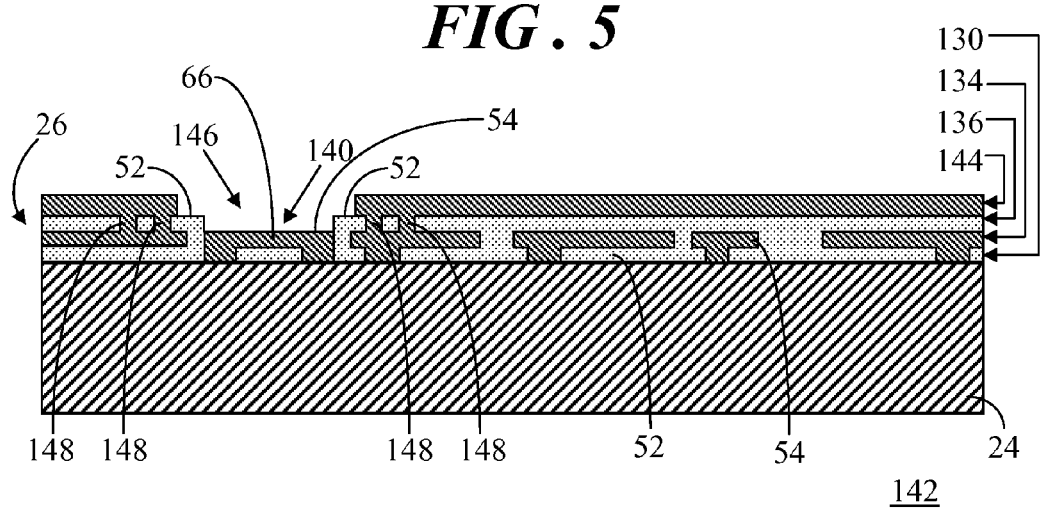
FIG. 5 shows a side sectional view of the structure of FIG. 3 at a subsequent stage of fabrication.

Referring to FIG. 5 in connection with sensor device fabrication process 110 (FIG. 3), FIG. 5 shows a side sectional view of the structure of FIG. 4 at a subsequent stage 142 of fabrication. Continuing with the forming of signal routing layer 26 in accordance with device structure formation block 112 of sensor device fabrication process 110, a second electrically conductive layer 144 of, for example, polysilicon 54, is deposited over second insulator layer 136. Second conductive layer 144 is suitably patterned and etched, as needed, to form an opening 146 extending through it and aligned with opening 140 formed in second insulator layer 136. Note that dielectric 52 of second insulator layer 136 surrounds the exposed polysilicon 54 of first conductive layer 134. This exposed polysilicon 54 of first conductive layer 134 will be reference element 66 for pressure sensor 38 (FIG. 1). Additionally, second conductive layer 144 is etched back so that it is electrically isolated from reference element 66 via dielectric 52 of second insulator layer 136.

In some fabrication processes, second conductive layer 144 acts as an electrical shield and is connected to ground. Thus, second conductive layer 144 may be a grounded electrical shield. Connections 148 formed between first conductive layer 134 and second conductive layer 144, can function as shunts for grounding certain regions of first conductive layer 134 to ground. These connections 148 are also electrically isolated from reference element 66 via first and second insulator layers 130, 136.

Thus, at stage 128 (FIG. 4) and stage 142 (FIG. 5), the various material layers of signal routing layer 26 are formed with second conductive layer 144 being the topmost layer. Additionally, pressure cavity 68 is produced in signal routing layer 26. Those skilled in the art will recognize that signal routing layer 26 may have more than or less than the illustrated conductive and dielectric layers suitably formed in accordance with a particular design.

Figure 6:
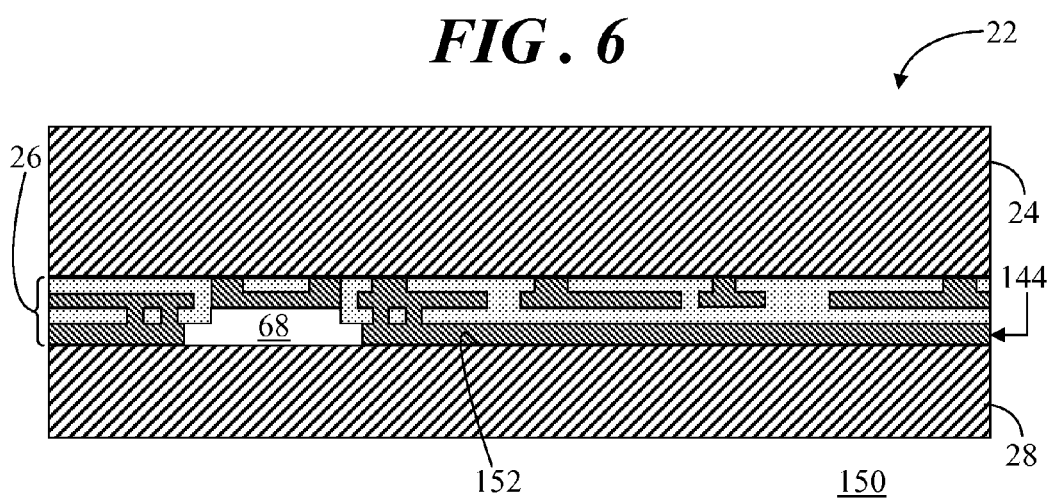
FIG. 6 shows a side sectional view of the structure of FIG. 4 at a subsequent stage of fabrication.

Referring to FIG. 6 in connection with sensor device fabrication process 110 (FIG. 3), FIG. 6 shows a side sectional view of the structure of FIG. 5 at a subsequent stage 150 of fabrication. Continuing with device structure formation block 112 of sensor device fabrication process 110, signal routing layer 26 is bonded to second wafer layer 28. That is, first wafer layer 24 with signal routing layer 26 formed thereon may be flipped and second conductive layer 144 is bonded with second wafer layer 28 to produce device structure 22.

In an embodiment, the topmost second conductive layer 144 of signal routing layer 26 is direct bonded to the single crystal silicon second wafer layer 28. A silicon-to-polysilicon direct bond is formed when the two materials are directly contacted without the assistance of any additional intermediate layers. A direct bonding process relies on the tendency for smooth surfaces to adhere, and can utilize some form of thermal cycling after contact to increase the bond strength. Such a direct bonding process results in an electrically conductive interface at the silicon to polysilicon junction between second conductive layer 144 of signal routing layer 26 and a surface 152 of second wafer layer 28.

Following bonding of signal routing layer 26 to second wafer layer 28, pressure cavity 68 is produced. Pressure cavity 68 is effectively hermetically sealed after bonding. In some embodiments, bonding may be performed in a low or vacuum environment so that the sealed pressure cavity 68 may be at a partial vacuum following bonding. Thereafter, second wafer layer 28 can function as a handle and as a ground wafer for the components of sensor device 20.

Referring to FIG. 7 in connection with sensor device fabrication process 110 (FIG. 3), FIG. 7 shows a side sectional view of the structure of FIG. 6 at a subsequent stage 154 of fabrication. In accordance with block 114 of sensor device fabrication process 110, the active transducer element(s) are formed in first wafer layer 24. In an example, first wafer layer 24 may be thinned from the full wafer thickness to the desired transducer thickness. The typical thickness of the active transducer element(s) can be from, for example, fifteen to sixty microns. At stage 154, following thinning, first wafer layer 24 is patterned and etched using, for example, a Deep Reactive Ion Etch (DRIE) technique or any suitable process to form active transducer element 42 of accelerometer 34 (FIG. 1), active transducer elements 44 of angular rate sensors 36 (FIG. 1), and any other elements of sensors 34, 36 in accordance with a particular design configuration of sensor device 20 (FIG. 1).

In addition, at least a portion of first insulator layer 130 underlying active transducer elements 42, 44 is removed to allow movement of, i.e., release of, active transducer elements 42, 44. By way of example, an oxide etch material or etchant may be introduced via openings 156 or spaces between active transducer elements 42, 44 in a known manner in order to remove the underlying first insulating layer 130. It should be observed that first conductive layer 134 remains following DRIE and the oxide etch so that the transducer cavities 86, 88 (FIG. 1) in which active transducer elements 42, 44 will eventually be located can be physically isolated from one another.

Referring to FIG. 8 in connection with sensor device fabrication process 110 (FIG. 3), FIG. 8 shows a side sectional view of the structure of FIG. 7 at a subsequent stage 158 of fabrication. In accordance with block 116 of sensor device fabrication process 110, third wafer layer 30 is attached with first wafer layer 24 of device structure 22 utilizing conductive bonding layer 80 to produce transducer cavities 86, 88. Additionally, conductive vias 96 are formed in third wafer layer 30 and bond pads 104 are formed on third wafer layer 30 in accordance with block 118 of sensor device fabrication process 110.

At stage 158, third wafer layer 30 is attached to device structure 22 via bonding layer 80 and optionally using spacers 84. In an embodiment, conductive bonding layer 80 may be produced utilizing a two layer metal bonding technique such as eutectic Al—Ge, eutectic AuSn, thermocompression Cu—Cu, or any of a variety of the bonding materials or by direct bonding, as mentioned above. Conductive bonding layer 80 not only forms a seal for each of transducer cavities 86 and 88, it additionally facilitates the conductive interconnection between the structures of device structure 22 and those on the remainder of device sensor 20 (e.g., conductive vias 96 and bond pads 104).

In an embodiment, attaching block 116 (FIG. 3) of fabrication process 110 represented at stage 158, may be performed under pressure conditions that are less than ambient pressure. For example, the attaching process may be performed under vacuum conditions. Thus, once bonded, transducer cavity 86 for accelerometer 34 and transducer cavities 88 for angular rate sensors 36 (FIG. 1) are formed with evacuated pressure. That is, the pressure within transducer cavities 86, 88 can be significantly less than ambient or atmospheric pressure. However, as will be discussed below, transducer cavity 86 may only temporarily be formed with evacuated pressure.

After third wafer layer 30 is coupled with device structure 22, conductive vias 96 may be formed. By way of example, openings may be pre-formed in third wafer layer 30. Alternatively, the openings may be formed extending through an entirety of third wafer layer 30 following attachment to device structure 22. The openings may be formed using DRIE, KOH, or any suitable etch techniques. Thereafter, the openings may be filled with an electrically insulating material, apertures may be formed extending through the insulating material residing in the openings, and a conductive material may be positioned in the apertures to form an electrically conductive connection (i.e., conductive vias 96) between sides 46 and 98 of third wafer layer 30. Further details for forming conductive vias 96 are not provided for brevity.

Bond pads 104 are formed on or in dielectric layer 102 on third wafer layer 30. Bond pads 104 may be formed by depositing, patterning, and etching a conductive material layer, e.g., metallization layer, on top of or in dielectric layer 102. Bond pads 104 may be utilized to electrically connect sensor device 20 to external components such as a printed circuit board, an integrated circuit die, and the like, not shown herein for simplicity.

Figure 9:
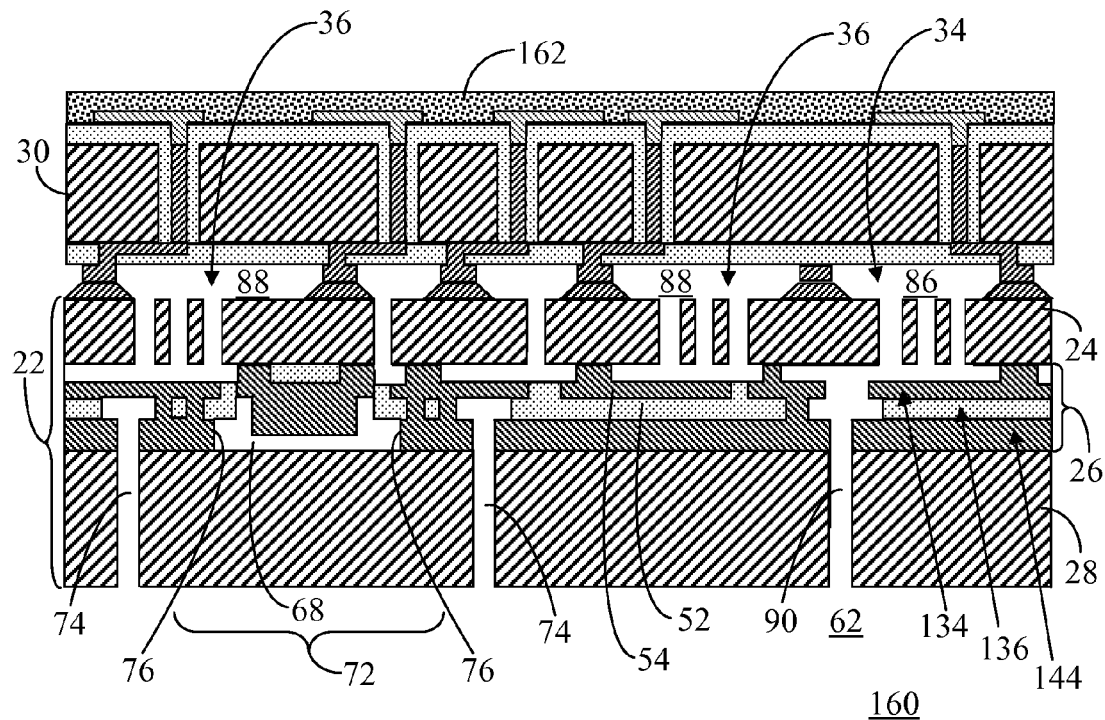
FIG. 9 shows a side sectional view of the structure of FIG. 7 at a subsequent stage of fabrication.

Now referring to FIG. 9 in connection with sensor device fabrication process 110 (FIG. 3), FIG. 9 shows a side sectional view of the structure of FIG. 8 at a subsequent stage 160 of fabrication. In accordance with block 120 of sensor device fabrication process 110, trenches 74, 90 are formed. That is, trench 74 surrounding region 72 of second wafer layer 28 is formed extending through an entirety of second wafer layer 28 and through portion 76 of signal routing layer 26. Concurrently, trench 90 is formed extending through second wafer layer 28 and extending through an entirety of signal routing layer 26 to expose transducer cavity 86 to external environment 62.

Prior to forming trenches 74 and 90, a temporary front side protective layer 162 may be deposited over bond pads 104 and dielectric layer 102 of third wafer layer 30. Protective layer 162 serves to protect the components of third wafer layer 30 during subsequent processing operations. Thereafter, one or more back side DRIE silicon etch processes may be performed to selectively etch through second wafer layer 28 and to selectively etch second conductive layer 144 and first conductive layer 134. Additionally, one or more oxide etch processes may be performed to etch through second insulator layer 136. The outcome of the etching processes is to stop the etching process at first conductive layer 134, e.g., polysilicon 54, around region 72 at which pressure sensor 38 (FIG. 1) will be formed to produce trench 74. Such a technique electrically isolates region 72 from the remainder of second wafer layer 28.

Another outcome of the etching processes is to form trench 90 extending entirely through signal routing layer 26 and thereby breach transducer cavity 86 for accelerometer 34. As mentioned previously, third wafer layer 30 may be attached to device structure 22 under, for example, vacuum conditions. Thus, once bonded, both of transducer cavities 86 and 88 are formed with evacuated pressure. That is, the pressure within transducer cavities 86, 88 can be significantly less than ambient or atmospheric pressure. After trench 90 is formed, transducer cavity 86 exhibits a different pressure. That is, transducer cavity 86 will not remain at vacuum once trench 90 is formed, but will instead return to the ambient pressure conditions under which trench 90 is being formed.

Angular rate sensors 36 typically operate most effectively in a vacuum atmosphere in order to achieve a high quality factor for low voltage operation and high signal response. Conversely, other types of MEMS sensor devices should operate in a non-vacuum environment in order to avoid an under damped response in which movable elements of the device can undergo multiple oscillations in response to a single disturbance. By way of example, accelerometer 34 may require operation in a damped mode in order to reduce shock and vibration sensitivity. Therefore, multiple sensors in a single package may have different pressure requirements for the cavities in which they are located. The presence of trench 90 extending to transducer cavity 86, but no trench extending to transducer cavities 88, enables the fabrication of a multi-stimulus sensor device in which the sensors that operate most effectively in a vacuum, or in a low pressure environment, can be located in transducer cavities 88 and the sensors that operate most effectively at higher pressure environments (e.g., ambient, atmospheric, or greater than atmospheric pressure) can be located in transducer cavity 86.

Figure 10:
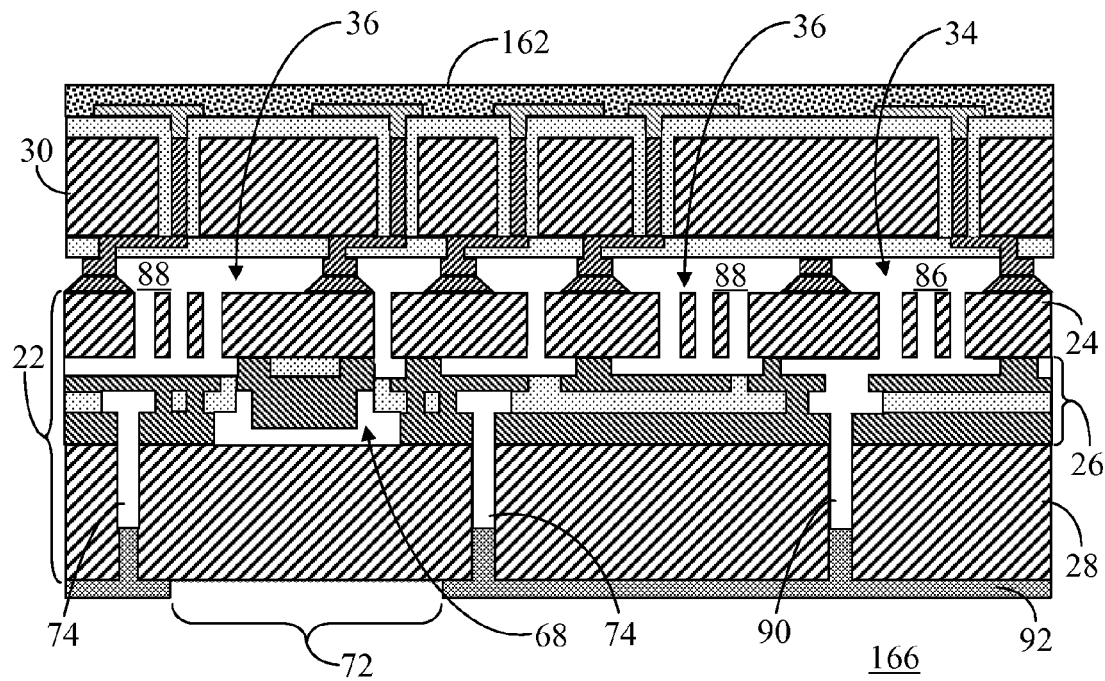
FIG. 10 shows a side sectional view of the structure of FIG. 8 at a subsequent stage of fabrication.

Referring to FIG. 10 in connection with sensor device fabrication process 110 (FIG. 3), FIG. 10 shows a side sectional view of the structure of FIG. 9 at a subsequent stage of fabrication. In accordance with block 122 of sensor device fabrication process 110, trenches 74 and 90 are sealed. For example, electrically isolating sealant material 92 is deposited in trenches 74 and 90. Trenches 74 and 90 are sealed to prevent contaminants from getting into sensor device 20, to increase the mechanical robustness of sensor device 20, and to form a new controlled pressure environment (e.g., ambient, atmospheric, or greater than atmospheric pressure) for transducer cavity 86 of accelerometer 34 relative to the pressure environment (e.g., vacuum or near vacuum) for angular rate sensors 36. However, region 72 of second wafer layer 28 at which pressure sensor 38 (FIG. 1) is to be formed need not include sealant material 92.

Figure 11:
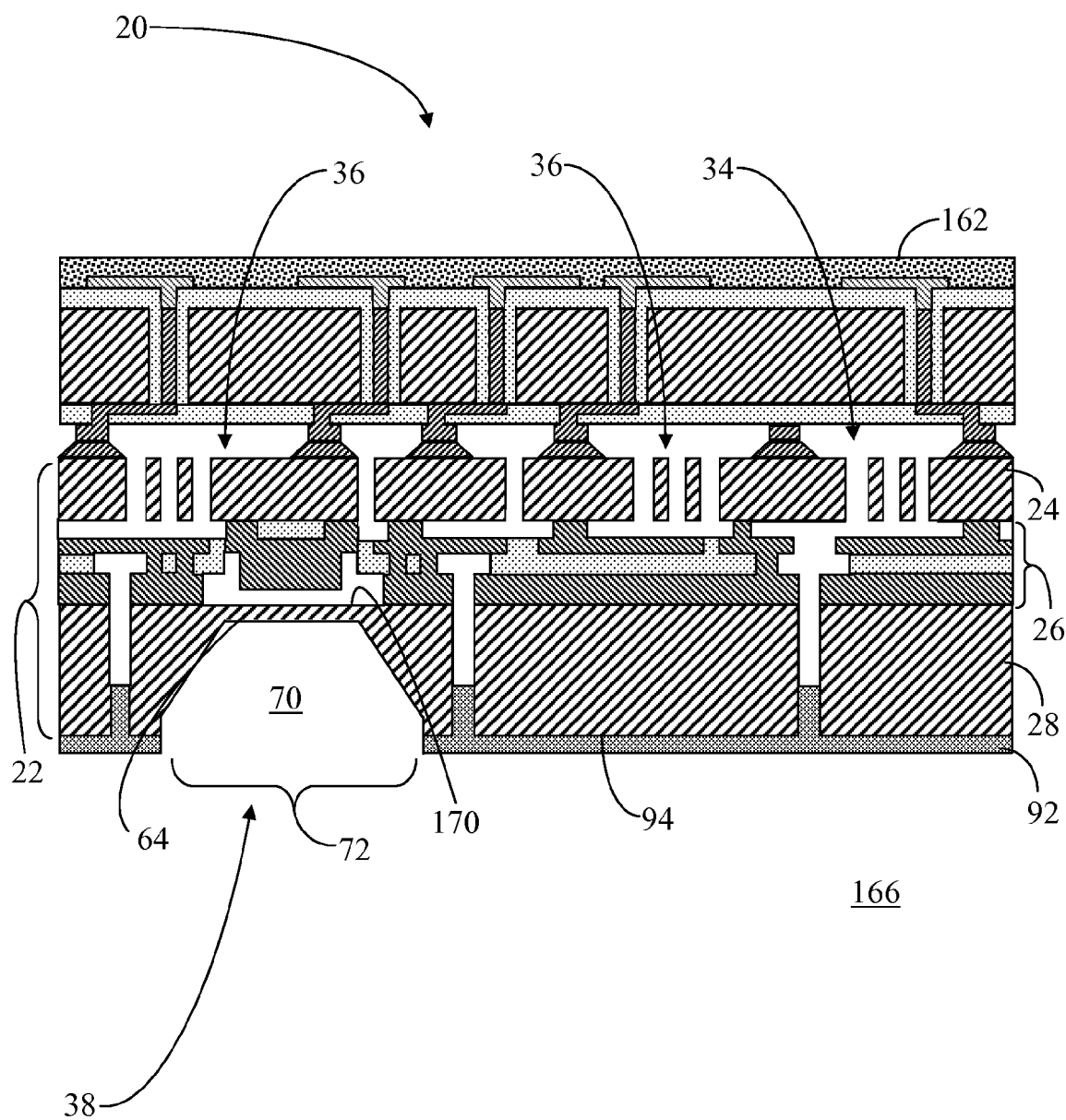
FIG. 11 shows a side sectional view of the structure of FIG. 9 at a subsequent stage of fabrication.

Now referring to FIG. 11 in connection with sensor device fabrication process 110 (FIG. 3), FIG. 11 shows a side sectional view of the structure of FIG. 10 at a subsequent stage 166 of fabrication. In accordance with block 124 of sensor device fabrication process 110, the active transducer element is formed in second wafer layer 28. In accordance with the illustrated embodiment, the active transducer element is diaphragm 64 for pressure sensor 38. By way of example, a DRIE etch technique, a Potassium Hydroxide (KOH) etch technique, or any suitable etch technique may be performed from back side 94 of second wafer layer 28 at region 72 to form port 70. The etch process is stopped prior to breaching the opposing side, i.e., a front side 170, of second wafer layer 28 such that the remaining thickness of second wafer layer 28 at front side 170 is diaphragm 64. In some embodiments, front side 170 of second wafer layer 28 may receive an implantation or other form of processing in order to better control the final thickness of diaphragm 64 during etching.

Following formation of diaphragm 64 for pressure sensor 38, protective layer 162 may be stripped in accordance with block 126 of sensor device fabrication process 110 to yield sensor device 20 having pressure sensor 38 that is vertically displaced from the other sensors, such as accelerometer 34 and angular rate sensors 36 as illustrated in FIG. 1.

It is to be understood that certain ones of the process blocks depicted in FIG. 3 may be performed in parallel with each other or with performing other processes. In addition, it is to be understood that the particular ordering of the process blocks depicted in FIG. 3 may be modified, while achieving substantially the same result. Accordingly, such modifications are intended to be included within the scope of the inventive subject matter. Further, the phraseology or terminology employed herein is for the purpose of description and not of limitation.

Thus, a microelectromechanical systems (MEMS) sensor device capable of sensing different physical stimuli and methodology for fabricating the sensor device have been described. An embodiment of a method of producing a sensor device comprises forming a device structure having a first wafer layer, a second wafer layer, and a signal routing layer interposed between the first and second wafer layers. A first active transducer element of a first sensor is formed in the first wafer layer. A trench is formed extending through the second wafer layer and extending through a portion of the signal routing layer. The trench electrically isolates a region of the second wafer layer surrounded by the trench from a remainder of the second wafer layer, and a second active transducer element of a second sensor is formed in the region of the second wafer layer.

An embodiment of a sensor device comprises a device structure having a first wafer layer, a second wafer layer, and a signal routing layer interposed between the first and second wafer layers. The sensor device further comprises a first active transducer element of a first sensor formed in the first wafer layer and a second active transducer element of a second sensor formed in the second wafer layer. A trench extends through the second wafer layer and through a portion of the signal routing layer to electrically isolate a region of the second wafer layer surrounded by the trench from a remainder of the second wafer layer, and the second active transducer element of the second sensor is formed in the region.

The processes and devices, discussed above, and the inventive principles thereof enable a technique for stacking multiple wafers with laterally and vertically spaced sensors to create multiple degree-of-freedom (DOF) sensor devices. The fabrication methodology exploits a polysilicon to silicon bonding technique (conductive interface) to form a pressure sensor from the back side of a handle wafer. The fabrication methodology further allows options for integration of a pressure sensor with a single crystal silicon (SCS) diaphragm. A pressure sensor cavity is formed in a signal routing layer between a portion of the handle wafer and a device wafer layer. Therefore, the pressure sensor and its cavity do not compete with sensors formed in the device wafer layer.

The fabrication methodology further enables the vertically and laterally spaced integrated sensors, each of which may sense a different physical stimulus, to be located in separate isolated cavities that exhibit different cavity pressures for optimal operation of each of the sensors. Accordingly, fabrication methodology described herein may yield a multiple stimulus sensor device with enhanced function, sensitivity, and durability, reduced dimensions, and that can be cost effectively fabricated utilizing existing manufacturing techniques.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method of producing a sensor device comprising:
   forming a device structure having a first wafer layer, a second wafer layer, and a signal routing layer interposed between said first and second wafer layers;
   forming a first active transducer element of a first sensor in said first wafer layer;
   forming a trench extending through said second wafer layer and extending through a portion of said signal routing layer, said trench surrounding a region of said second wafer layer, and said trench electrically isolating said region of said second wafer layer surrounded by said trench from a remainder of said second wafer layer;
   forming a second active transducer element of a second sensor in said region of said second wafer layer to produce said sensor device that includes both of said first and second sensors each being capable of sensing a different physical stimulus; and
   attaching a third wafer layer with said first wafer layer, said attaching operation producing a cavity in which said first active transducer element is located.

2. The method of claim 1 wherein said forming said device structure comprises:
   forming said signal routing layer on a first surface of said first wafer layer;
   producing a cavity in said signal routing layer; and
   bonding said signal routing layer with said second wafer layer such that said cavity is vertically aligned with said region of said second wafer layer surrounded by said trench.

3. The method of claim 2 wherein said bonding operation comprises hermetically sealing said cavity.

4. The method of claim 1 wherein said second active transducer element in said second wafer layer is vertically spaced apart from said first active transducer element in said first wafer layer.

5. The method of claim 1 further comprising forming a third active transducer element of a third sensor in said first wafer layer, said third active transducer element being laterally spaced apart from said first active transducer element of said first sensor.

6. The method of claim 1 wherein:
   said method further comprises forming a conductive via extending through said third wafer layer; and
   said attaching operation comprises utilizing a conductive bonding layer to form a conductive interconnection between said third wafer layer and said first wafer layer, said conductive via being electrically coupled with said conductive bonding layer.

7. The method of claim 1 wherein said trench is a first trench and said forming said trench further comprises forming a second trench extending through said second wafer layer and extending through an entirety of said signal routing layer to said cavity.

8. The method of claim 7 wherein:
   prior to forming said second trench, said cavity exhibits a first pressure;
   following said forming said second trench said cavity exhibits a second pressure that is different from said first pressure; and
   said method further comprises depositing a sealant material in said second trench such that said cavity is sealed at said second pressure.

9. A method of producing a sensor device comprising:
   forming a device structure having a first wafer layer, a second wafer layer, and a signal routing layer interposed between said first and second wafer layers, wherein said forming said device structure comprises:
   forming said signal routing layer on a first surface of said first wafer layer;
   producing a cavity in said signal routing layer; and
   bonding said signal routing layer with said second wafer layer such that said cavity is vertically aligned with said region of said second wafer layer surrounded by said trench, wherein said second wafer layer comprises a single crystal silicon, a topmost layer of said signal routing layer comprises a polysilicon layer, and said bonding operation comprises performing direct bonding of said polysilicon layer to said single crystal silicon to provide electrical contact between said polysilicon layer to said single crystal silicon;
   forming a first active transducer element of a first sensor in said first wafer layer;
   forming a trench extending through said second wafer layer and extending through a portion of said signal routing layer, said trench surrounding a region of said second wafer layer, and said trench electrically isolating said region of said second wafer layer surrounded by said trench from a remainder of said second wafer layer; and forming a second active transducer element of a second sensor in said region of said second wafer layer to produce said sensor device that includes both of said first and second sensors each being capable of sensing a different physical stimulus.

10. A method of producing a sensor device comprising:

forming a device structure having a first wafer layer, a second wafer layer, and a signal routing layer interposed between said first and second wafer layers;

forming a first active transducer element of a first sensor in said first wafer layer;

forming a trench extending through said second wafer layer and extending through a portion of said signal routing layer, said trench surrounding a region of said second wafer layer, and said trench electrically isolating said region of said second wafer layer surrounded by said trench from a remainder of said second wafer layer; and forming a second active transducer element of a second sensor in said region of said second wafer layer to produce said sensor device that includes both of said first and second sensors each being capable of sensing a different physical stimulus, wherein said forming said second active transducer element comprises etching said second wafer layer from a first side of said second wafer layer at said region, said etching stopping prior to breaching a second side of said second wafer layer such that a remainder of said second wafer at said second side is said second active transducer element.

11. The method of claim 10 wherein said second sensor is a pressure sensor, and said second active transducer element comprises a diaphragm of said pressure sensor.

12. A method of producing a sensor device comprising:

forming a device structure having a first wafer layer, a second wafer layer, and a signal routing layer interposed between said first and second wafer layers;

forming a first active transducer element of a first sensor in said first wafer layer;

forming a trench extending through said second wafer layer and extending through a portion of said signal routing layer, said trench surrounding a region of said second wafer layer, and said trench electrically isolating said region of said second wafer layer surrounded by said trench from a remainder of said second wafer layer;

depositing a sealant material in said trench; and forming a second active transducer element of a second sensor in said region of said second wafer layer to produce said sensor device that includes both of said first and second sensors each being capable of sensing a different physical stimulus.

13. The method of claim 12 wherein said forming said second active transducer element occurs following said depositing said sealant material in said trench.

14. A sensor device comprising:

a device structure having a first wafer layer, a second wafer layer, and a signal routing layer interposed between said first and second wafer layers;

a first active transducer element of a first sensor formed in said first wafer layer; and a second active transducer element of a second sensor formed in said second wafer layer, wherein a trench extends through said second wafer layer and through a portion of said signal routing layer, said trench surrounding a region of said second wafer layer and electrically isolating said region of said second wafer layer surrounded by said trench from a remainder of said second wafer layer, wherein said second active transducer element of said second sensor is formed in said region, said sensor device includes both of said first and second sensors each being capable of sensing a different physical stimulus, and wherein said second sensor comprises a pressure sensor, said second active transducer element is a diaphragm of said pressure sensor, and a pressure cavity is formed in said signal routing layer, said pressure cavity being vertically aligned with said diaphragm.

* * * * *